(12) United States Patent
Hobden

(10) Patent No.: US 10,522,893 B2
(45) Date of Patent: Dec. 31, 2019

(54) RADAR SYSTEM

(71) Applicant: Navtech Radar Limited, Oxfordshire (GB)

(72) Inventor: Mervyn Keith Hobden, Lincoln (GB)

(73) Assignee: Navtech Radar Limited (GB)

( * ) Notice: Subject to any disclaimer, the term of this patent is extended or adjusted under 35 U.S.C. 154(b) by 902 days.

(21) Appl. No.: 14/901,862

(22) PCT Filed: Jul. 2, 2014

(86) PCT No.: PCT/GB2014/052018
§ 371 (c)(1),
(2) Date: Dec. 29, 2015

(87) PCT Pub. No.: WO2015/001342
PCT Pub. Date: Jan. 8, 2015

(65) Prior Publication Data
US 2016/0204496 A1    Jul. 14, 2016

(30) Foreign Application Priority Data

Jul. 2, 2013  (GB) .................................. 1311830.2

(51) Int. Cl.
*G01S 7/03*    (2006.01)
*G01S 7/28*    (2006.01)
(Continued)

(52) U.S. Cl.
CPC .............. *H01P 5/024* (2013.01); *G01S 7/034* (2013.01); *G01S 7/28* (2013.01); *G01S 7/35* (2013.01);
(Continued)

(58) Field of Classification Search
CPC .... H01P 5/024; H01P 3/16; H01P 5/19; G01S 7/034; G01S 7/28; G01S 7/35; H03H 7/38
(Continued)

(56) References Cited

U.S. PATENT DOCUMENTS 3,306 A * 10/1843 Johnson .................. A47L 13/46
15/151
2,789,271 A * 4/1957 Budenbom ............. H01P 5/222
333/120
(Continued)

FOREIGN PATENT DOCUMENTS

CN        103348529      10/2013
GB        1002808 A       9/1965
(Continued)

OTHER PUBLICATIONS

Notification of the First Office Action dated Feb. 2, 2018 (English); CN Application No. 2014800456192; Navtech Radar Limited; 7 pages.
(Continued)

*Primary Examiner* — Vladimir Magloire
*Assistant Examiner* — Nuzhat Pervin
(74) *Attorney, Agent, or Firm* — Boyle Fredrickson, SC

(57) ABSTRACT

A waveguide assembly for use in a radar. The waveguide assembly being fabricated from a di-electric material and comprising a beamsplitter which comprises a right circular cylinder having a quarter wave air gap substantially along a centreline of the right circular cylinder. The waveguide assembly further comprises a waveguide on a port of the beamsplitter. In at least one construction, the waveguide assembly comprises four ports: a transmit input arranged to
(Continued)

receive a signal from a source, a receive output arranged to direct a return signal to a receiver, and output port, and a load port.

20 Claims, 4 Drawing Sheets

(51) Int. Cl.
  *G01S 7/35* (2006.01)
  *H01P 3/16* (2006.01)
  *H01P 5/02* (2006.01)
  *H01P 5/19* (2006.01)
  *H03H 7/38* (2006.01)
(52) U.S. Cl.
  CPC .................. *H01P 3/16* (2013.01); *H01P 5/19* (2013.01); *H03H 7/38* (2013.01)
(58) Field of Classification Search
  USPC ........................................................ 342/200
  See application file for complete search history.

(56) References Cited

U.S. PATENT DOCUMENTS

| | | | | | |
|---|---|---|---|---|---|
| 3,019,431 | A | * | 1/1962 | De Poy, II | G01S 7/034 342/198 |
| 3,032,726 | A | * | 5/1962 | Fink | H01P 1/067 333/263 |
| 3,460,067 | A | * | 8/1969 | Burnsweig, Jr. | H03C 7/02 342/200 |
| 3,568,188 | A | * | 3/1971 | Fishbein | G01S 13/36 342/109 |
| 3,982,213 | A | * | 9/1976 | Smith | H01P 1/19 333/158 |
| 4,148,035 | A | * | 4/1979 | Foldes | H01Q 25/04 343/754 |
| 4,187,470 | A | * | 2/1980 | Frosch | H01P 1/39 330/4 |
| 4,333,076 | A | * | 6/1982 | Cachier | G01S 7/02 333/137 |
| 4,480,233 | A | * | 10/1984 | Juul | H03B 9/143 331/107 P |
| 4,857,935 | A | * | 8/1989 | Bates | G01S 7/034 342/128 |
| 4,985,708 | A | * | 1/1991 | Kelly | H01Q 21/064 343/771 |
| 5,041,840 | A | * | 8/1991 | Cipolla | H01P 1/173 343/700 MS |
| 5,544,268 | A | * | 8/1996 | Bischel | G02F 1/011 385/4 |
| 5,604,469 | A | * | 2/1997 | Ishikawa | G01S 7/032 333/1.1 |
| 5,647,036 | A | * | 7/1997 | Deacon | G02F 1/035 385/27 |
| 5,724,463 | A | * | 3/1998 | Deacon | G02F 1/035 385/10 |
| 5,835,458 | A | * | 11/1998 | Bischel | G11B 7/122 369/44.12 |
| 5,911,018 | A | * | 6/1999 | Bischel | G02F 1/011 385/11 |
| 5,912,997 | A | * | 6/1999 | Bischel | G02F 1/011 385/15 |
| 5,943,155 | A | * | 8/1999 | Goossen | G02B 26/02 359/247 |
| 5,978,524 | A | * | 11/1999 | Bischel | G02F 1/011 385/4 |
| 6,008,775 | A | * | 12/1999 | Bobowicz | H01Q 3/26 343/770 |
| 6,078,704 | A | * | 6/2000 | Bischel | G02F 1/011 385/4 |
| 6,118,908 | A | * | 9/2000 | Bischel | G02F 1/011 385/14 |
| 6,141,465 | A | * | 10/2000 | Bischel | G02F 1/011 385/4 |
| 6,195,035 | B1 | * | 2/2001 | Wood | G01S 7/032 342/149 |
| 6,239,757 | B1 | * | 5/2001 | Ishikawa | G01S 7/032 343/711 |
| 6,480,078 | B2 | * | 11/2002 | Kim | H01P 1/20318 333/202 |
| 6,522,794 | B1 | * | 2/2003 | Bischel | G02F 1/011 385/4 |
| 6,700,539 | B2 | * | 3/2004 | Lim | H01Q 1/40 343/700 MS |
| 7,466,970 | B2 | * | 12/2008 | Niiranen | H01P 1/2053 333/202 |
| 8,467,133 | B2 | * | 6/2013 | Miller | G02B 27/017 353/28 |
| 9,093,735 | B2 | | 7/2015 | Barth | |
| 2002/0109829 | A1 | | 8/2002 | Hayes | |
| 2010/0104236 | A1 | * | 4/2010 | Keating | H01P 1/165 385/11 |
| 2010/0245154 | A1 | * | 9/2010 | Szajnowski | G01S 7/023 342/90 |
| 2013/0099874 | A1 | * | 4/2013 | Bromberger | H03F 1/0288 333/32 |
| 2013/0106456 | A1 | * | 5/2013 | Weikle, II | G01R 1/06744 324/754.06 |
| 2013/0127980 | A1 | * | 5/2013 | Haddick | G06F 3/013 348/14.08 |
| 2013/0201070 | A1 | * | 8/2013 | Parsche | H01Q 7/00 343/786 |
| 2013/0278631 | A1 | * | 10/2013 | Border | G02B 27/017 345/633 |
| 2018/0188542 | A1 | * | 7/2018 | Waldern | G06F 3/0433 |

FOREIGN PATENT DOCUMENTS

| | | | | |
|---|---|---|---|---|
| GB | 1 069 470 | A | | 5/1967 |
| GB | 1069470 | A | * | 5/1967 ........... G02B 27/283 |
| GB | 1181633 | A | * | 2/1970 ............ G01S 7/034 |

OTHER PUBLICATIONS

A Grating-Based Circular Polarization Duplexer for Submillimeter-Wave Transceivers; IEEE Microwave and Wireless Components Letters, vol, 22, No. 3, Mar. 2012.
Quasi-Optical Duplexer in 220GHz; Jiechen Chen; ICMMT 2010 Proceedings; 4 pages.
Notification of the First Office Action dated Feb. 2, 2018 (Chinese); CN Application No. 2014800456192; Navtech Radar Limited; 5 pages.

* cited by examiner

RADAR SYSTEM

This invention relates to a radar system, a radar head for such a system and a waveguide, suitable for use in such a system. In particular, but not exclusively, the invention relates to an FMCW radar, which might in particular be a millimetre-wave radar.

It is known that, in a radar system, it is desirable to efficiently use the signal generated by the source of radio waves, to efficiently direct the return signal to the receiver and to try and ensure that signal leakage does not contaminate the return signal.

Some radar systems have utilised quarter-wave beam splitters but the implementation of such radars have had problems in the design which have led to a loss in one or both of the signal generated front the source of radio waves and return signal.

According to a first aspect of the invention there is provided a waveguide assembly for use in a radar, the waveguide assembly being fabricated from a di-electric material and comprising a right cylinder having a quarter wave air gap substantially along a centreline of the right cylinder.

The waveguide assembly may typically be thought of as being a diplexer.

The quarter wave air gap is preferably centred at the frequency of operation whatever that may be.

Preferably, the radar is an FMCW (frequency-modulated continuous-wave) radar. Alternatively, the radar may be a pulse radar or an FMICW (frequency-modulated interrupted continuous-wave) radar.

Embodiments using a right cylinder in this manner are believed advantageous as they make use of the better modal structure of a right cylinder gives sufficient spacing between modes for most practical applications.

Conveniently, the waveguide assembly comprises four ports. Typically these ports comprise a transmit input arranged to receive a signal from a source; a receive output arranged to direct a return signal to a receiver; an output port; and a load port.

Embodiments may provide a matching transformer on at least some of the ports. End portions of at least some of the matching transformers may be of a complementary shape to the that of the beamsplitter in order to assist in signal transfer between the two. In some embodiments end regions of the at least some mulching transformers may be concave. Such embodiments, in which end regions of the matching transformers are of complementary shape to the right-cylinder are believed advantageous since they provide for ease of assembly of the waveguide assembly and/or any radar or radar head in which the waveguide assembly is placed; the waveguide assembly might be thought of as being self-aligning.

Accordingly, in embodiments that utilise matching transformers on e port there may well then be no dielectric media transition to be compensated for, from that port, to the plane of the beamsplitter (ie the quarter wave air gap). Typically, the ports are arranged to minimise external radiation from the surface of the transformer, by matching of the phase velocity within the transformer with that of the external mode so as to produce cancellation, by the means of a conical structure of the correct taper.

Conveniently, the path length from the transmit input port to the output port has a path length which is of substantially the same length as the path length from the output port to the receive output port. Such embodiments are convenient as they can provide good thermal stability.

A matching material may be used between at least some of the matching transformers and the beamsplitter. The matching material may be a liquid, such as silicone grease, or any suitable stable material whose dielectric constant matches that of the right cylinder and other components of the waveguide assembly.

Embodiments may provide the matching transformers as substantially conical in shape and/or circular in cross-section.

A frame, such as an E-plane split waveguide frame, may be provided to hold the waveguide assembly.

One or more portions of the frame may be arranged to receive end regions of the matching transformers. The or each portion of the frame may be arranged to transition a channel of a first shape to a channel of a second shape. The first shape may be substantially circular. The second shape may be substantially rectangular. Such embodiments allow a transition to be provided from a TE10 waveguide to a TE11 mode matching transformer.

A load may be associated with the load port of the beamsplitter.

The load may be fed by a further matching transformer. Such a further matching transformer may have a substantially planar end region adjacent the beamsplitter, which embodiments are convenient to allow for rotation and displacement of the matching transformer, and/or components associated therewith (for example the load).

In other embodiments the further matching transformer may be provided with a face that is of complementary shape to that of the beamsplitter, such as a convex face, adjacent the beamsplitter. In such embodiments, the complex match may be generated by movement and rotation or the load, or at least parts of the load or by electrical means.

Therefore, an adjustment mechanism may be provided to adjust the load thereby allowing the complex impedance of the load to be varied. In some embodiments, the adjustment mechanism may be provided by a mechanical mechanism arranged to move the further matching transformer relative to the beamsplitter. Thus, the adjustment means may provide what may be thought of as a tuneable load.

In other embodiment the adjustment means may be an electrical means arranged to vary an electrical parameter of the load. In such embodiments, the adjustment means may comprise a PIN diode.

An output lens or other quasi-optical element may be provided in association with the output port of the beamsplitter.

Further, embodiments may provide an antenna in association with the output port of the beamsplitter.

The antenna may have a feed which is substantially co-axial with a beam path of a beam leaving the output port of the beam splitter. This beam path may be shared between an output wave leaving the beamsplitter and a return signal being input to the beamsplitter from the antenna.

According to a second aspect of the invention there is provided a radar head, which is typically a millimetre-wave radar head, comprising at least some of the following elements:

a source of radio waves coupled to a di-electric waveguide arranged to guide radio waves generated by the source to an antenna, via a beam splitter, to generate an output signal, the beam splitter comprising a quarter-wave air gap substantially along a centreline of a right cylinder;

the beam splitter being arranged such that the radio waves travel from the source to the antenna along a first path;

the antenna also being arranged to receive a return signal and being arranged to direct that return signal via the beam splitter to a receiver such that the return signal travels from the antenna through the beam splitter to the receiver, along a second path different from the first;

wherein a portion of the first and second paths between the beam splitter and the antenna is shared between the paths and the first and second paths are provided by a substantially continuous di-electric material; and wherein the antenna is arranged to rotate such that the axis of rotation of the antenna is substantially co-axial with the shared portion of the first and second paths.

The radar head may be an FCMW millimetre-wave radar head; the skilled person will appreciate that other radar types are possible.

Thus, at least some embodiments of the invention provides complete secondary quasi-optical system is in one di-electric medium, with a single air interface to a primary lens, or reflector.

According to a third aspect of the invention there is provided a radar incorporating a waveguide assembly and/or a radar head according to the first or second aspects of the invention.

Typically, the frequency modulation of the radar is arranged to be swept over a frequency range of up to substantially 2% of the transmit frequency.

Conveniently, the radar is an FMCW radar; the skilled person will appreciate that other radar types are possible.

Conveniently, embodiments are provided with a load on a port of the beamsplitter which is arranged to be able to maintain a substantially constant signal to noise performance over at least that range. Typically, the load is variable.

At least some embodiments of such a radar are believed advantageous as further quasi-optical elements can be incorporated into the beam path with no, or low risk, of degradation in the overall return loss across the working bandwidth due to the lack of transitions between materials, etc. of the beam carrying components (eg transformers, beamsplitter, lens, etc).

The skilled person will appreciate that features described in relation to any one aspect of the invention may be applied, mutatis mutandis, to any of the other aspects of the invention.

Conveniently, the radar is a millimetre-wave radar.

There now follows, by way of example only, and with reference to the accompanying drawings, a detailed description of an embodiment of the invention, of which:

Figure 1:
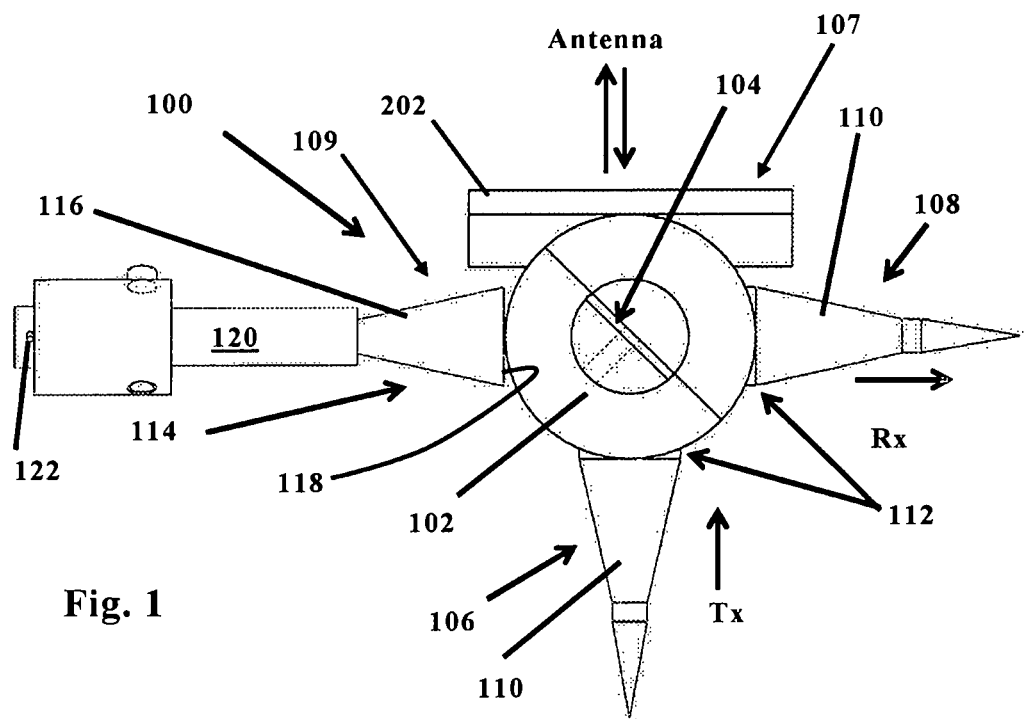
FIG. 1 shows a plan view of a waveguide assembly employing an embodiment of the invention.

FIG. 1 shows a waveguide arrangement 100 which is a feature a radar head described herein. This waveguide arrangement 100 comprises a beamsplitter 102 provided by a right-cylinder having an air gap 104 substantially along a centre line of the right cylinder. The centre line bisects the cylinder along the length of the cylinder, such that, in the case of a right circular cylinder, the circular cross-section is split into two semicircles.

The air gap 104 substantially encompasses an operational width of the right cylinder. The operational width refers to that portion of the diameter of the cylinder which is both illuminated by a source and seen by an antenna at the position of the air gap 104 of the beamsplitter 102. The air gap is a quarter wave air gap and extends across substantially the full diameter of the beamsplitter cylinder. The air gap is centred at the frequency of operation.

The waveguide arrangement 100 also comprises four ports: a transmit input 106 and a receive output 108 respectively arranged to have input thereto an output signal from a source of radio waves to an antenna and receive the return signal from that same antenna and guide the return signal to a receiver; an output port 107; and a load port 109. Each of the transmit input 106 and the receive output 108 comprise a dielectric matching transformer 110 arranged to provide a transition from rectangular to circular waveguide used in TE11 mode to directly transition into dielectric matching transformers in intimate electrical contact with the walls of the right cylinder.

Typically, end regions 112 of each of the matching transformers 110 are concave and complementary shaped to the right cylinder 102. As such, those end regions can be placed in intimate contact with the right cylinder to reduce signal loss and/or reflection between signals travelling in the beam splitter 102 and the transformers 110. Conveniently, embodiments will use a matching material, whose di-electric constant is close to that of the main media, between the matching transformer 110 and the beam splitter 102 to further help ensure transmission of the signals travelling therein. The matching material may conveniently be a liquid such as silicone grease, or the like.

A fourth port 114 of the waveguide arrangement 100 comprises a matching transformer 116 (which may be thought of as a further matching transformer) having a substantially flat (ie substantially planar) race 118 at the end region thereof adjacent the beamsplitter 102.

In the embodiment being described each of the three matching transformers 110, 116 are tapered to a point such that a 3.5 mm circular waveguide can be attached. The tapered section to 3.5 mm diameter circular guide is arranged to provide a match into the overmoded conical structure of the respective transformer. Other embodiments may use a diameter of other than 3.5 mm, dependent on the desired frequency of application.

A waveguide 120 connects, and terminates, the matching transformer 116 of the fourth port to a load fabricated from circular, rectangular section or other cross section lossy material 122, such as Eccosorb™ available from Emerson & Cuming Microwave Products N.V.; (www.eccosorb.eu). Other embodiments may use other materials or electronic methods as described below. The matching transformer 116, waveguide 120 and load 122 provides a complex match, with both real and imaginary components, capable of being varied in both amplitude and phase with respect to the finite return loss at the beamsplitter plate.

The skilled person will appreciate that some small degree of cross polarisation may occur at the beamsplitter. By varying one or both of the distance of the flat face of the transformer 116 from the periphery of the beamsplitter, and the angle of rotation, together with the electrical length to the calibrated mismatch, it is found that any level of combined mismatch found in practice, resulting from the other three ports (ie feed to the antenna, transmit (Tx) and receive (Rx)), may be balanced and cancelled out, optimising power transfer, and minimising noise figure into the receiver. A mechanical, or other physical means, may be provided to adjust any one or more of the distance of the flat face of the transformer 116 from the periphery of the beamsplitter, and the angle of rotation, together with the electrical length to the calibrated mismatch.

The performance of the beamsplitter is affected by the match on its four ports, as well as the inherent return loss of the beamsplitter itself (ie the substantially 3 dB loss as the signal passes through the beamsplitter in either direction). If the match on the four ports is not compensated, the isolation between the TX 106 and RX 108 ports is degraded, and leakage power from the Tx port is demodulated in the receiver mixer (eg 706), leading to Amplitude Modulation to Phase Modulation conversion and/or a poor noise figure. Thus, embodiments that utilise a load, which may be tuneable, will typically have an improved performance. Some embodiments may also use a low noise amplifier, as discussed below, and in such embodiments leakage power from the Tx (ie transmit input) port via the beamsplitter can saturate the amplifier, leading to gain compression, and a raised noise figure.

Thus, in use, the source of radio-waves generates a signal which is transmitted to the transmit input 106, through the beamsplitter 102, via the output port 107 to an antenna. This path may be thought of as being a first path.

The radar return signal is received at the antenna, is fed to the output port 107, to the beamsplitter 102, via the receive output 108 to a receiver. This path may be thought of as being a second path.

The skilled person will note that a portion of the first and second paths between the beamsplitter and the antenna is shared between the paths. Typically, the antenna is mounted such that it is rotated about an axis of this shared path and thus may be thought of as being substantially co-axial with this shared path.

Figure 2:
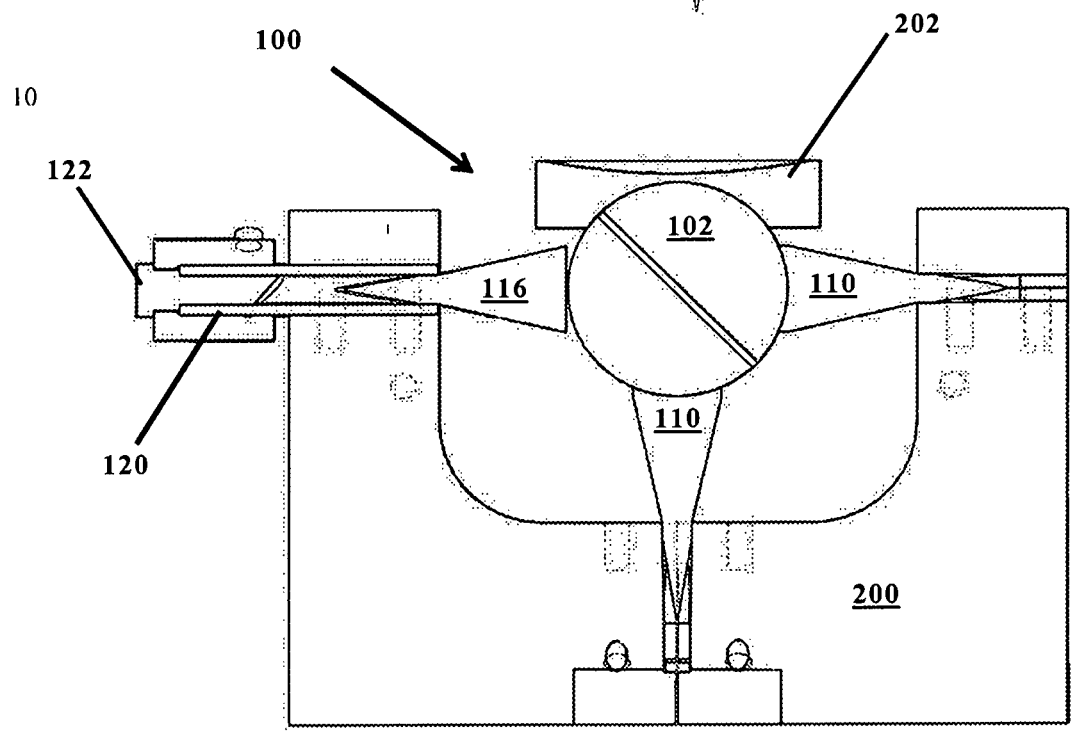
FIG. 2 shows the waveguide assembly of FIG. 1 in a radar head, or at least a portion of a radar head.
Figure 4:
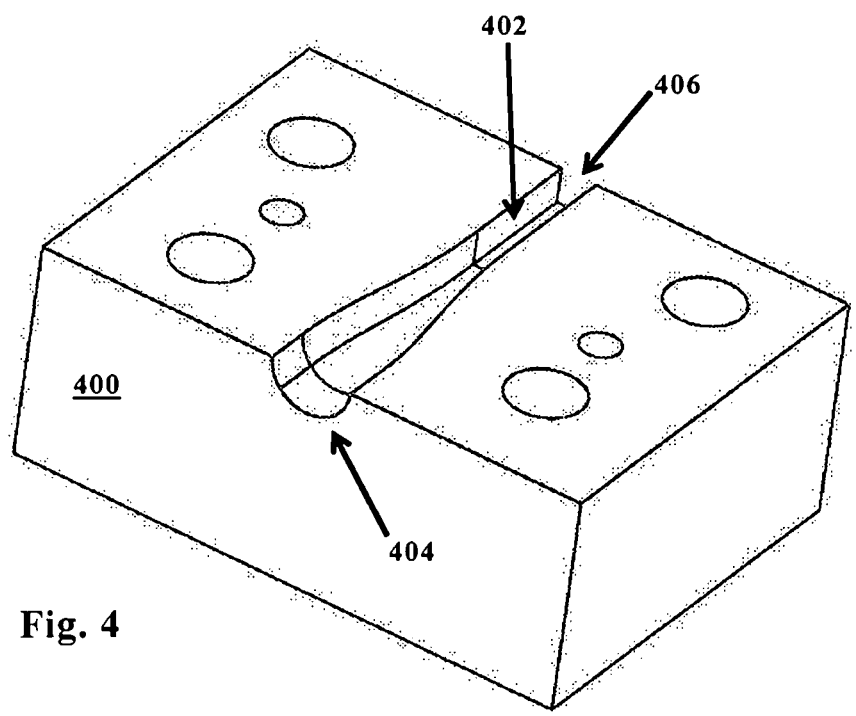
FIG. 4 shows a portion of a component arranged to mount the waveguide assembly of FIG. 1 within the radar head of FIG. 2.
Figure 5:
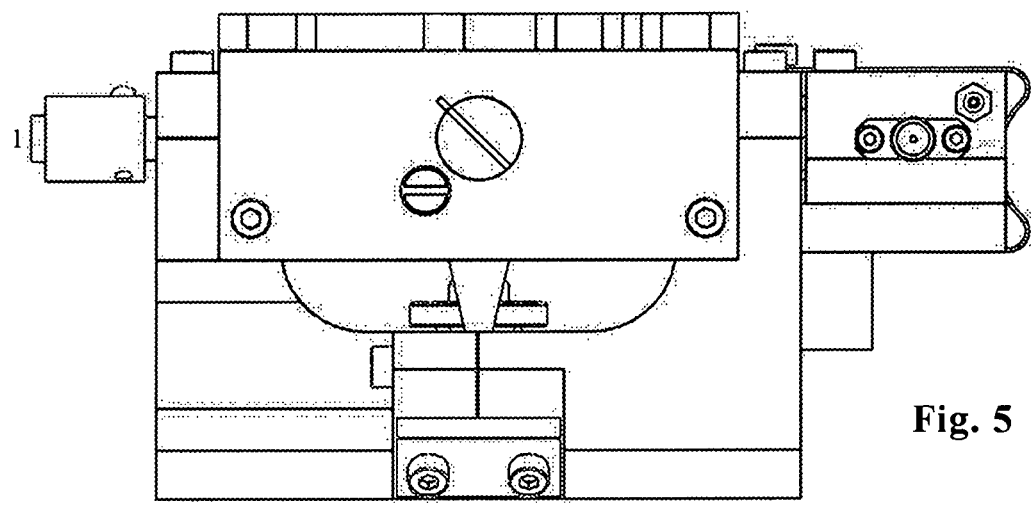
FIG. 5 shows an end elevation of the radar head of FIG. 3.

FIG. 2 shows the waveguide assembly 100 of FIG. 1 mounted such that the matching transformers 110, 116 are mounted within an E-plane split waveguide frame 200. Further details of the frame 200 are shown in FIG. 4 which shows details of how a transition is made from a substantially rectangular cross-section waveguide (eg 120) to interface with the circular cross-section matching transformers 110, 116. Other embodiments, known to a skilled person, using fabricated waveguide components are equally applicable.

FIG. 2 also shows an output lens element 202 positioned in the path between the beamsplitter 102 and the antenna of the system 100. The lens may be a positive or negative, or combination thereof, optical elements. FIG. 2 shows a concave lens (ie a negative optical element) the surface of which, adjacent the beamsplitter 102, is shaped so as to co-operate with the surface of the beamsplitter 102. As with the concave end regions of the matching transformers 110, 116 this shaping can help embodiments so shaped to reduce signal propagation problems (eg reflections and/or refractions, etc) as a signal travels between the beamsplitter 102 and the lens 202. A matching material may be used between the beamsplitter 102 and the lens 202.

Figure 3:
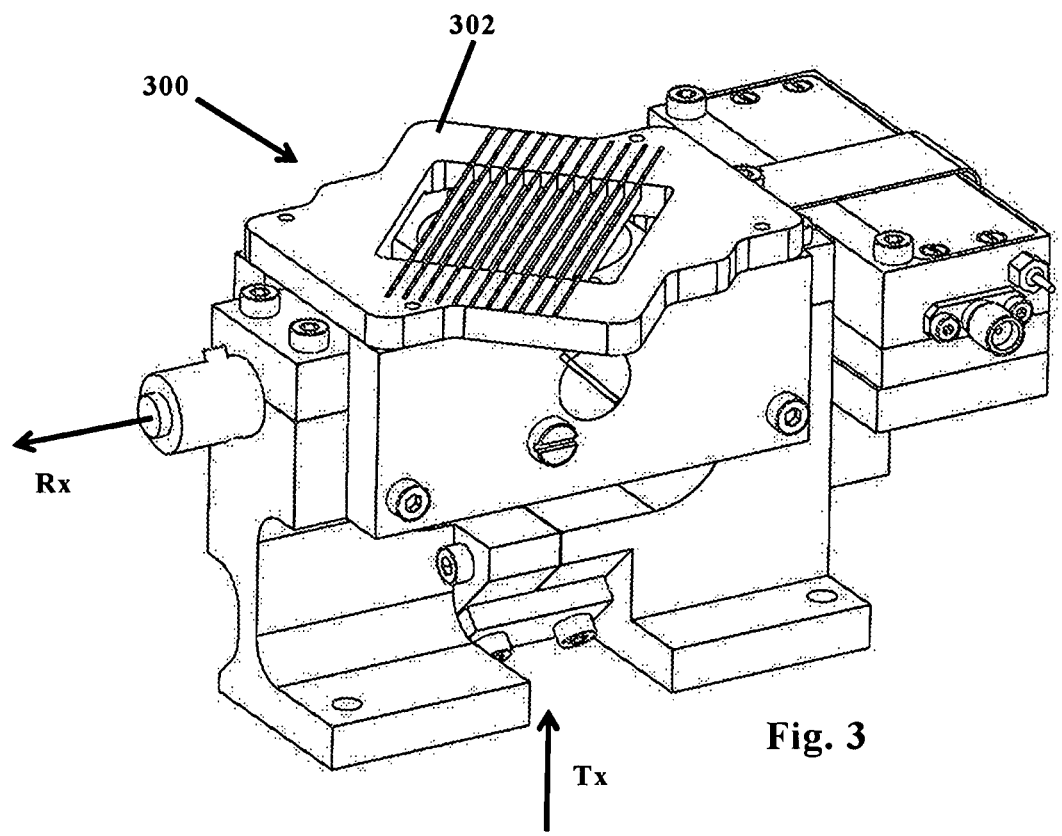
FIG. 3 shows further components added to the radar head of FIG. 2.

FIG. 3 shows the assembly of FIG. 2 with further components mounted thereon to form a radar head 300. One of the components comprises a quarter wave plate 310, in the path between the beamsplitter and the antenna, which may be provided in some embodiments if it is desired to give circular polarisation. Such embodiments may be used to improve rain out performance. In the embodiment shown in the Figures a vane type plate, air spaced in front of the negative element 202 at the beamsplitter egress to the main lens focal path. In some embodiments, this quarter wave plate 310 is permanently (or at least releasably) fixed in position. In other embodiments the quarter wave plate may be arranged to be selectively insertable into the optical path such as by using electro-mechanical means.

In other embodiments, a dielectric based quarter wave plate may be substituted for the vane type plate. However, the skilled person will appreciate that such a dielectric based quarter wave plate increases the focal length but this may be acceptable depending upon the remainder of the components.

FIG. 4 shows a portion 400 of the E-plane split waveguide frame 200 of FIG. 2. The portion 400 would, in an assembled frame 200, be abutted against another portion having a similarly shaped channel 402 therein. The two channels 402 come together to form a duct having a circular opening (providing a first shape) at a first end region 404 thereof and a rectangular opening (providing a second shape) at a second end region 406 thereof. The circular opening is arranged to receive a matching transformer 110, 116 whereas the rectangular opening is arranged to receive a rectangular cross-section wave guide. Thus, the portion 400 provides a transition from the TE10 waveguide to the matching transformer in TE11 mode.

The embodiment described above had a mechanical, or other physical, adjustment means to tune the load 122. Other embodiments may use an electronically tuneable mismatch. Such an electronically tuneable mismatch may comprise a PIN diode based variable mismatch, consisting of a PIN attenuator diode followed by a PIN diode terminated ¼ wave stub. By monitoring both the amplitude of return from a target, and the average noise floor, a convergence system can be constructed to control the current supplied to the two PIN diodes, so as to produce the best results. The convergence system may be arranged to automatically adjust the mismatch, perhaps by varying the resistance offered by the PIN diode. Further, the convergence system may be provided in software, hardware, firmware or a combination of these.

The peak of the signal amplitude, at the load 122, is a slow varying function as the matching element is adjusted, while the noise floor reduction is fairly sharp. Thus, embodiments can utilise this difference in operational response as the response bandwidths are different. For example, embodiments may be arranged such that the convergence system is tuned to maximise the first order signal response, and then a fine adjustment is made, using the calibrated mismatch while monitoring the peak signal level, to maximise the signal to noise ratio. The two responses, peak and null, are not coincident, but in practice, are close enough, that once the peak signal is established, it varies very little over the swept range of the Frequency Modulation of the FMCW radar of the embodiment being described, and with time, so that with fixed antenna gain and match, it is not necessary to adjust the S/N ratio while in normal use.

Figure 6:
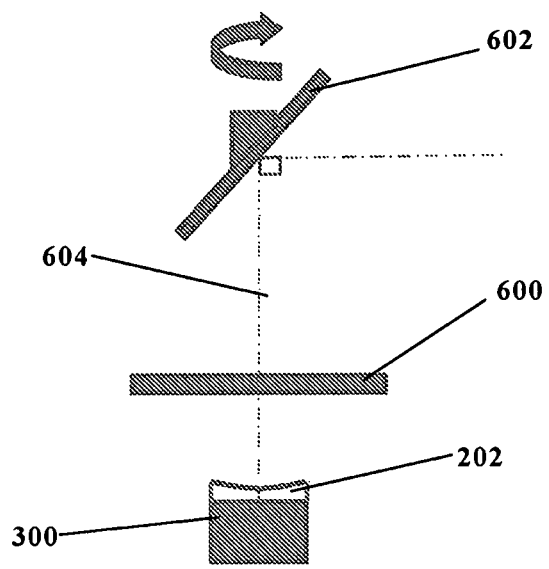
FIG. 6 shows a schematic arrangement of the blocks of components of a radar utilising the components shown in the other Figures.

FIG. 6 shows the radar head 300 and the output lens (in this case a negative lens) mounted in relation to a Fresnel lens 600 and the antenna 602. The antenna 602 is arranged to rotate substantially about the output beam 604 which as discussed above is co-axial with the shared portion of the first and second paths.

Figure 7:
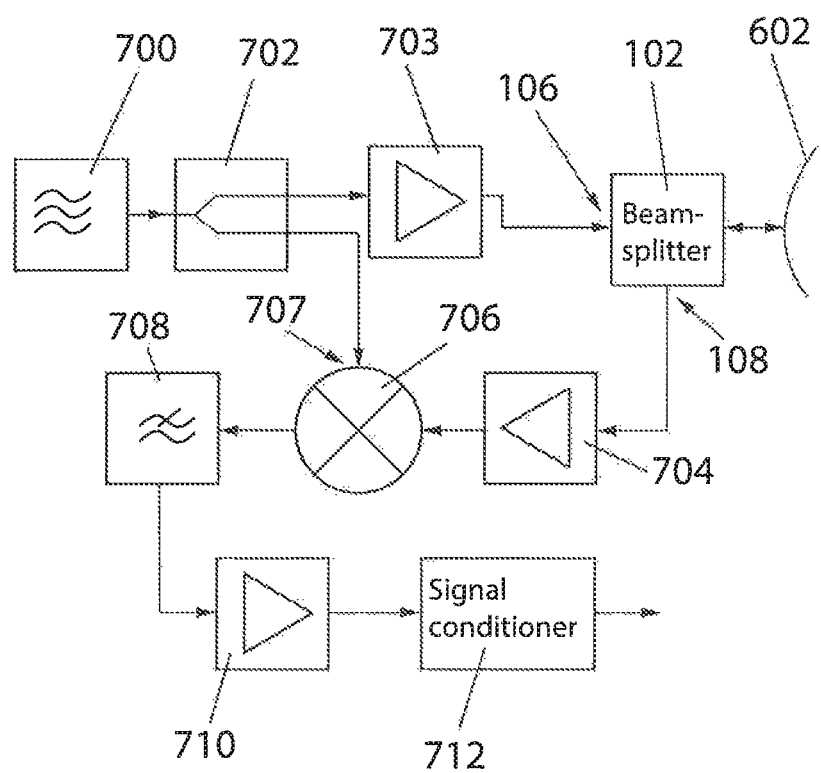
FIG. 7 shows, schematically, block components within a radar utilising components shown in the other Figures.

Referring to FIG. 7 then the source of radio waves 700 is seen to feed a divider 702 which passes some of the radio waves, via a power amplifier 703, to the transmit input port (Tx) 106 of the beamsplitter 102, which feeds via the antenna 602 via the first path.

Embodiments having the power amplifier 703 helps to isolate the local oscillator 707 port on the mixer 706 from the return loss of the beamsplitter 102 and antenna 602.

The return signal is received at the antenna 602, passes along the second path through the beamsplitter 102 and out of the receive output port 108 and is fed to a Low Noise Amplifier (LNA) 704. Embodiments utilising a LNA 704 are advantageous as it provides isolation of the mixer return loss from the beamsplitter 102 and through to the antenna 602.

The output from the LNA 704 is fed to a mixer 706 along with some of the signal generated by the source and the mixed signal is passed through a low pass amplifier 708 before being amplified 710 and otherwise conditioned 712 (such as being converted to a digital signal).

As such, embodiments having a both a power amplifier 704 and low noise amplifier 704, in conjunction with the high isolation provided by the beamsplitter 102 are advantageous in that they may be easier to set up than prior art radar system and adjustment of the quasi-optical path lengths being less critical.

The invention claimed is:

1. A waveguide assembly for use in a radar, the waveguide assembly being fabricated from a di-electric material and comprising:
   i. a beamsplitter which comprises a right circular cylinder having a quarter wave air gap substantially along a centreline of the right circular cylinder; and
   ii. a waveguide on a port of the beamsplitter.

2. The waveguide assembly of claim 1, wherein the waveguide assembly comprises four ports.

3. The waveguide assembly of claim 2, wherein the four ports comprise the following:
   i. a transmit input arranged to receive a signal from a source;
   ii. a receive output arranged to direct a return signal to a receiver;
   iii. an output port; and
   iv. a load port.

4. The waveguide assembly of claim 2, further comprising a matching transformer on at least some of the ports.

5. The waveguide assembly of claim 3, wherein a path length from the transmit input port to the output port is of substantially the same length as a path length from the output port to the receive output port.

6. The waveguide assembly of claim 4, further comprising a matching material between at least some of the matching transformers and the beamsplitter, and wherein preferably wherein the matching material has a dielectric constant substantially equal to that of the right cylinder and other components of the waveguide assembly.

7. The waveguide assembly of claim 1, further comprising a frame to hold the waveguide assembly, wherein the frame is an E-plane split waveguide frame, and wherein optionally one or each portion of the frame is arranged to transition a channel of a first shape to a channel of a second shape, and wherein the first shape is substantially circular and the second shape is substantially rectangular.

8. The waveguide assembly of claim 3, further comprising a load associated with the load port.

9. The waveguide assembly of claim 4, wherein a further matching transformer is arranged to feed the load, and wherein the further matching transformer comprises at least one of the following:
   i. a substantially planar end region adjacent the beamsplitter;
   ii. a face that is of complementary shape to that of the beamsplitter adjacent the beamsplitter; and
   iii. a face that is substantially convex.

10. The waveguide assembly of claim 9, further comprising an adjustor arranged to allow the complex impedance of the load to be varied, wherein optionally the adjustor is one of the following:
    i. a mechanical mechanism arranged to move the further matching transformer relative to the beamsplitter; or
    ii. an electrical adjustor arranged to vary an electrical parameter of the load.

11. The waveguide assembly of claim 1, further comprising an antenna in association with the output port, wherein the antenna has a feed which is substantially co-axial with a beam path of a beam leaving the output port, and wherein optionally the beam path is shared between an output wave leaving the beamsplitter and a return signal being input to the beamsplitter from the antenna.

12. The waveguide assembly of claim 1 for use in a radar of one of the following types:
    i. FMCW radar;
    ii. Pulse radar; or
    iii. FMICW radar.

13. A radar head comprising a waveguide assembly according to claim 1.

14. A radar incorporating a waveguide assembly according to claim 1.

15. The radar according to claim 14, wherein a frequency modulation of the radar is arranged to be swept over a frequency range of up to substantially 2% of a transmit frequency.

16. The radar according to claim 14, wherein a load is provided on a port of the beamsplitter.

17. A radar incorporating a radar head according to claim 13.

18. The radar according to claim 14, wherein the radar is a millimetre-wave radar.

19. The radar according to claim 14, wherein the radar is one of the following types:
    i. FMCW radar;
    ii. Pulse radar; or
    iii. FMICW radar.

20. The radar according to claim 14, wherein the radar further comprises additional quasi-optical elements incorporated into a beam path.

* * * * *